United States Patent [19]
Ludikhuize et al.

[11] Patent Number: 5,786,252
[45] Date of Patent: Jul. 28, 1998

[54] METHOD OF MANUFACTURING A SEMICONDUCTOR DEVICE, AND SEMICONDUCTOR DEVICE MANUFACTURED BY SUCH A METHOD

[75] Inventors: Adrianus W. Ludikhuize, Eindhoven; Maarten J. Van Dort, Nijmegen, both of Netherlands

[73] Assignee: U.S. Philips Corporation, New York, N.Y.

[21] Appl. No.: 812,185

[22] Filed: Mar. 6, 1997

[30] Foreign Application Priority Data

Mar. 6, 1996 [EP] European Pat. Off. ............ 96200614

[51] Int. Cl.⁶ ............................................. H01L 21/8234
[52] U.S. Cl. ....................................... 438/275; 438/302
[58] Field of Search ............................. 438/302, 268, 438/275, 277

[56] References Cited

U.S. PATENT DOCUMENTS

| | | |
|---|---|---|
| 4,329,186 | 5/1982 | Kotecha et al. . |
| 5,156,989 | 10/1992 | Williams et al. . |
| 5,550,067 | 8/1996 | Kuroyanagi et al. . |
| 5,618,743 | 4/1997 | Williams et al. ............ 438/276 |
| 5,674,762 | 10/1997 | See et al. . |

FOREIGN PATENT DOCUMENTS

0453070A2  10/1991  European Pat. Off. .

*Primary Examiner*—John Niebling
*Assistant Examiner*—Richard A. Booth

[57] ABSTRACT

A deep diffusion of the back-gate region provided in a self-aligned manner with respect to the gate electrode is necessary in a DMOS transistor for obtaining a sufficiently high punch-through voltage between source and drain. The combination of a comparatively heavy back-gate implantation and a light source implantation and a heavy source implantation with spacer on the gate electrode, and the use of interstitial diffusion and accelerated diffusion owing to crystal damage render it possible to carry out said diffusion of the back-gate region at a comparatively low temperature, for example below 950 °C. This renders it possible to integrate a DMOST into, for example, standard VLSI CMOS where first $\delta V_{th}$ and channel-profile implantations are carried out, and subsequently the poly gates are provided, which means that a diffusion step at a temperature above 1,000 °C. of long duration is no longer allowed. The effect may be enhanced in that the doping of the back-gate region is increased during the p-type LDD implantation of a p-channel MOS and/or the p-type well implantation of an n-channel MOS.

8 Claims, 7 Drawing Sheets

METHOD OF MANUFACTURING A SEMICONDUCTOR DEVICE, AND SEMICONDUCTOR DEVICE MANUFACTURED BY SUCH A METHOD

Method of manufacturing a semiconductor device, and semiconductor device manufactured by such a method.

BACKGROUND OF THE INVENTION

The invention relates to a method of manufacturing a semiconductor device with a DMOS transistor and a MOS transistor in a common semiconductor body. The invention also relates to a semiconductor device manufactured by such a method. Such a method is known inter alia from the published European Patent Application EP-A 0 453 070 A2.

It is usual in small-signal MOS transistors such as occur, for example, in standard CMOS circuits to provide one or several dopants in the channel region, for example for adjusting the threshold voltage $V_T$ or the breakdown voltage between source and drain (punch-through voltage). These dopants are provided in usual CMOS processes before the gate electrode is formed above the channel region. The back-gate region is obtained in a DMOS transistor through diffusion of impurities which are provided after the gate electrode has been defined. Since these impurities have to diffuse comparatively far below the gate electrode, inter alia for obtaining a sufficiently high source/drain punch-through voltage in combination with a low threshold voltage, a high-temperature step of long duration is necessary for forming the back-gate region. Such a step, however, is preferably avoided after said dopants have been provided in the channel region of the small-signal MOS transistors for preventing redistribution of these impurities.

The cited EP-A 0 453 070 has suggested to form the gate electrode of the DMOS transistor from a first layer of polycrystalline silicon (called poly hereinafter), then to diffuse the back-gate region, and subsequently to carry out the critical implantations into the channel region of the small-signal MOS transistor, followed by the deposition of a second poly layer and the definition of the gate electrode of the MOS transistor from this poly layer. It is possible to avoid or at least substantially reduce degradation of the quality of the MOS transistor caused by the DMOS transistor in that the process steps for manufacturing the MOS transistor are separated as much as possible from those for manufacturing the DMOS transistor. This advantage is obtained, however, as a result of a considerable increase in the complexity of the process compared with usual CMOS processes without DMOS transistors.

SUMMARY OF THE INVENTION

The invention has for its object inter alia to provide a simpler method whereby degradation of the properties of the small-signal MOS transistors owing to the specific process steps necessary for the manufacture of the DMOS transistor is at least substantially prevented.

According to the invention, a method of the kind described in the opening paragraph is characterized by the following steps:

local definition of a first active region at the surface of the semiconductor body for the DMOS transistor and of a second active region at the surface of the semiconductor body for the MOS transistor;

provision of an electrically insulating layer on the first active region and on the second active region as a gate dielectric for the DMOS transistor and the MOS transistor;

introduction of a dopant into the channel region of the MOS transistor to be formed in the second active region;

provision of a silicon layer on the semiconductor body, which layer is insulated from the surface of the semiconductor body by the gate dielectric at least at the areas of the first and the second active region, and formation by photolithographic means of gate electrodes of the DMOS transistor and the MOS transistor from said silicon layer;

formation of a p-type back-gate region for the DMOS transistor through a comparatively deep implantation of boron ions into the first active region with the gate electrode of the DMOS transistor acting as a mask, whereby the back-gate region is aligned with an edge of the gate electrode;

formation of a lightly doped n-type portion of the source zone of the DMOS transistor through an implantation of n-type ions with a comparatively low doping level into the back-gate region with the gate electrode of the DMOS transistor acting as a mask, whereby the lightly doped portion of the source zone is aligned with said edge of the gate electrode;

a diffusion step in which the boron atoms are caused to diffuse farther into the semiconductor body at a temperature lower than 1,000° C.;

provision of a spacer on the gate electrode of the DMOS transistor and the local provision of a comparatively strongly doped source zone at a distance from the gate electrode;

provision of source and drain zones for the MOS transistor. The process according to the invention is simpler than the known process because a single poly layer can suffice for forming the gate electrodes of the DMOS transistor and the MOS transistor. The conditions are such during the above diffusion step that diffusion of boron is promoted by interstitial diffusion and by damage in the crystal lattice caused by the implantation. The result is that the boron can diffuse sufficiently in lateral direction below the gate electrode, whereas the n-type dopant in the lightly doped portion of the source zone is substantially inactive in this respect. A lateral profile may thus be obtained in the channel of the DMOST whereby punch-through at low voltage is prevented. The diffusion step is in addition so light that diffusion into the channel region of the other MOS transistor does not or substantially not affect the properties of this transistor adversely.

The above diffusion step is preferably carried out under conditions which promote the diffusion of boron so as to limit the diffusion time as much as possible. A method according to the invention is for this purpose characterized in that the semiconductor body is subjected to an oxidation step during said diffusion step for promoting the diffusion of boron atoms. The (light) oxidation of silicon introduces crystal defects into the lattice which have a diffusion-accelerating effect on boron.

A further embodiment of a method according to the invention is characterized in that As or Sb is taken as the dopant for forming the lightly doped portion of the source zone of the DMOST. Diffusion of the lightly doped portion of the source is advantageously further limited by the low diffusion rate of As (or Sb) in this embodiment as compared with, for example, phosphorus and boron.

The temperature at which the diffusion is carried out is so chosen that the impurity in the channel region of the other MOS transistor does not or substantially not diffuse at a comparatively high diffusion of the boron atoms in the back-gate region. A preferred embodiment is characterized in that the diffusion step in which the boron atoms in the back-gate region diffuse farther into the semiconductor body is carried out at a temperature equal to or lower than 950° C. A suitable temperature found in practice was approximately 750° C. A further embodiment of a method according to the invention is characterized in that the implantation of boron ions from the back-gate region is carried out at least partly at an angle such that ions are implanted below the gate electrode of the DMOS transistor. The oblique implantation direction renders it possible to implant the boron ions below the gate electrode so that a greater channel length can be achieved in the DMOS transistor at a given duration of the diffusion step, or a shorter diffusion step can suffice for a given channel length.

The punch-through voltage between source and drain can be further increased through an increase in the doping concentration in the back-gate region at the area of the channel of the DMOS transistor. A method according to the invention whereby this can be achieved without additional process steps is characterized in that the p-type doping in the back-gate region is increased at least locally by a doping step carried out simultaneously with the formation of the LDD portion of a p-channel LDD MOS transistor.

The punch-through voltage may be further increased in that the p-well of a normal NMOS is locally provided before the gate electrode is provided, while at the same time boron is applied in the DMOST back-gate region to be formed.

BRIEF DESCRIPTION OF THE DRAWINGS

These and other aspects of the invention will be explained in more detail with reference to a few embodiments and the accompanying diagrammatic drawing, in which.

DETAILED DESCRIPTION

The present embodiment relates to the manufacture of an integrated circuit comprising a DMOST in combination with a CMOST circuit. It will be obvious that the invention may be used to advantage not only for complementary MOS transistors but also for manufacturing a DMOS transistor in a unipolar process, for example an n-channel MOST process.

Figure 1:
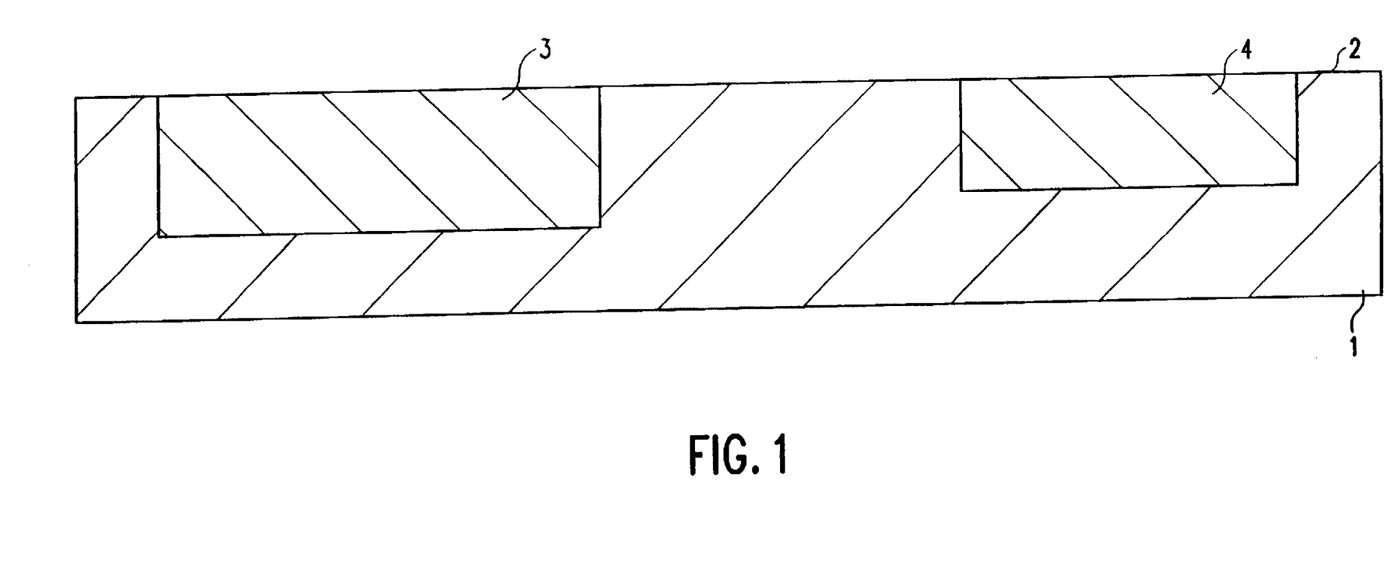
FIGS. 1 to 6 show an integrated circuit in cross-section in a few stages of its manufacture by a method according to the invention.

The process starts with a semiconductor body 1 of silicon (FIG. 1) of which at least a region adjoining a surface 2 is of the p-type. The body 1 is provided in usual manner with n-type surface regions 3 and 4, referred to as wells hereinafter, which define active regions for the DMOS transistor and the p-channel MOS transistor, respectively. In principle, the wells 3 and 4 could be provided in a common doping step. In the present example, the wells 3 and 4 were provided in separate doping steps, which renders it possible to form optimized doping profiles for the DMOS transistor and the p-channel transistor.

Figure 2:
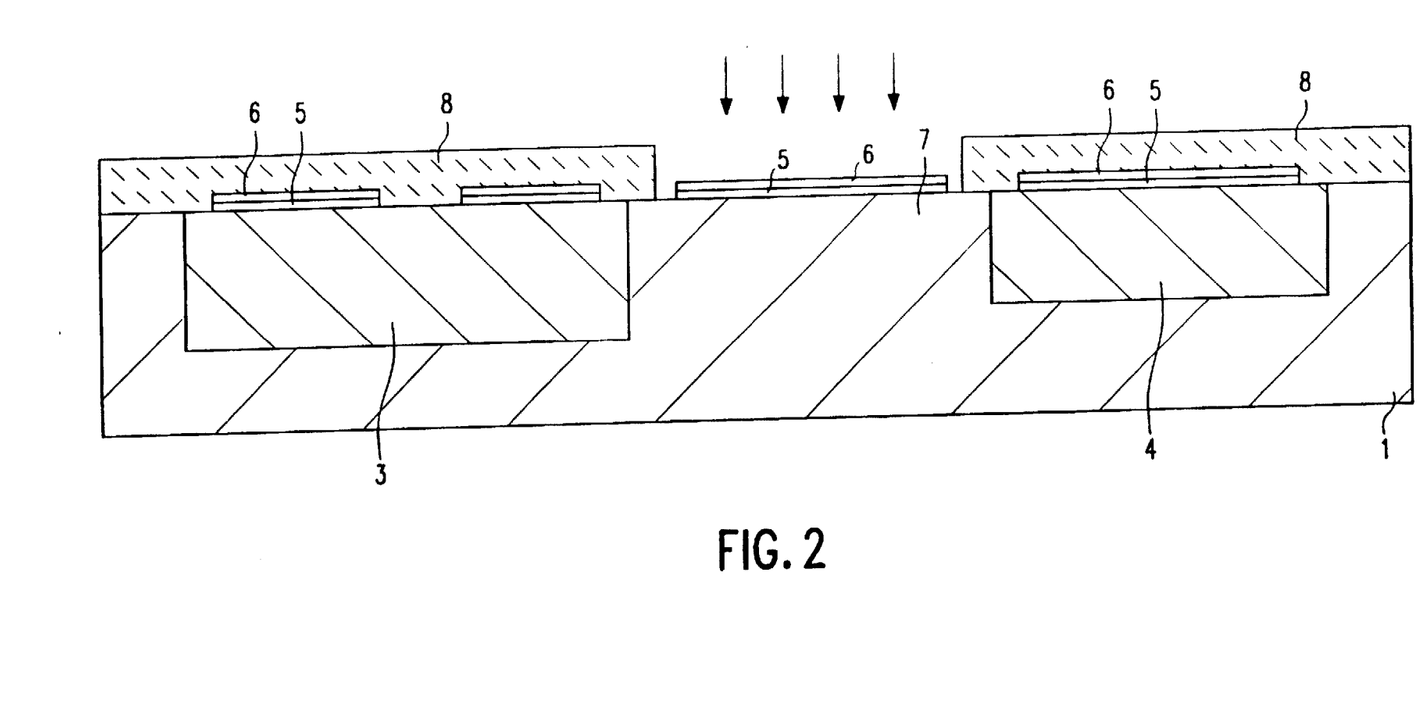

In a next stage depicted in FIG. 2, an anti-oxidation mask is formed on the surface, which mask comprises, for example, a layer 5 of silicon oxide and a layer 6 of silicon nitride. The anti-oxidation mask covers not only the region of wells 3 and 4, but also defines a p-type region 7 which forms an active region for an n-channel MOS transistor. After the anti-oxidation mask 5, 6 has been provided, the surface is given an implantation mask 8 which leaves the active region 7 exposed. The doping concentration in the active region 7 is increased through implantation of boron, diagrammatically indicated with arrows, so as to increase the punch-through voltage between source and drain of the n-channel transistor. The implantation energy is chosen such that the boron ions penetrate through the layers 5 and 6 into the silicon. If so desired, a p-type channel stopper may also be provided in this stage through implantation of boron ions whose energy is so low that the ions do not penetrate through the layers 5 and 6 but only enter the semiconductor body next to these layers. The mask 8 can be removed again after the implantation.

Figure 3:
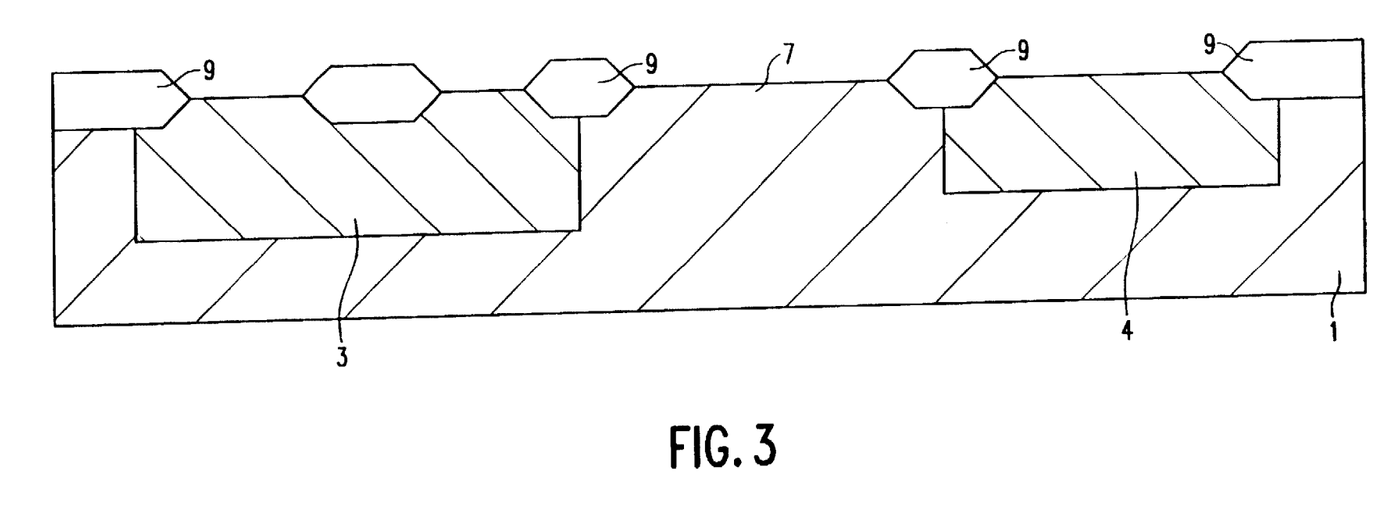
Figure 4:
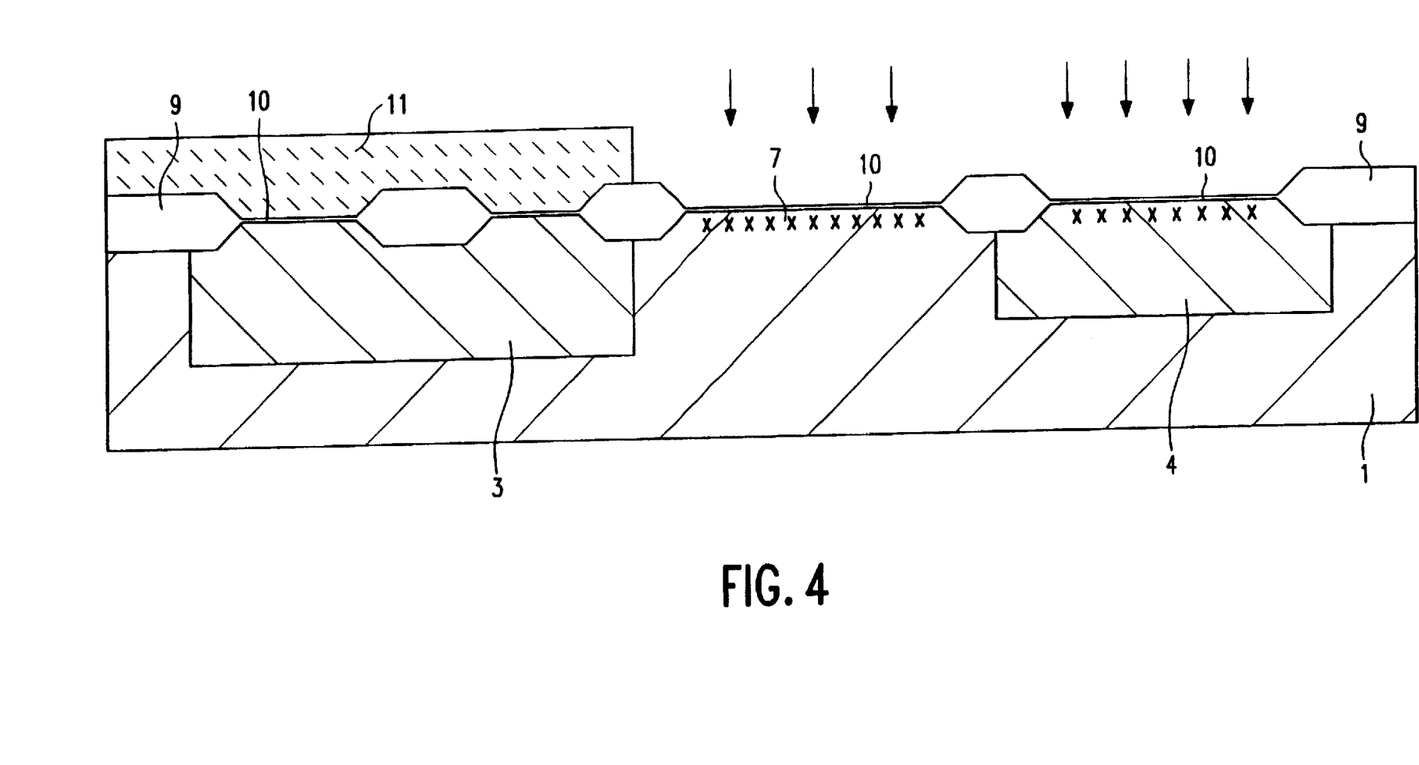
Figure 5:
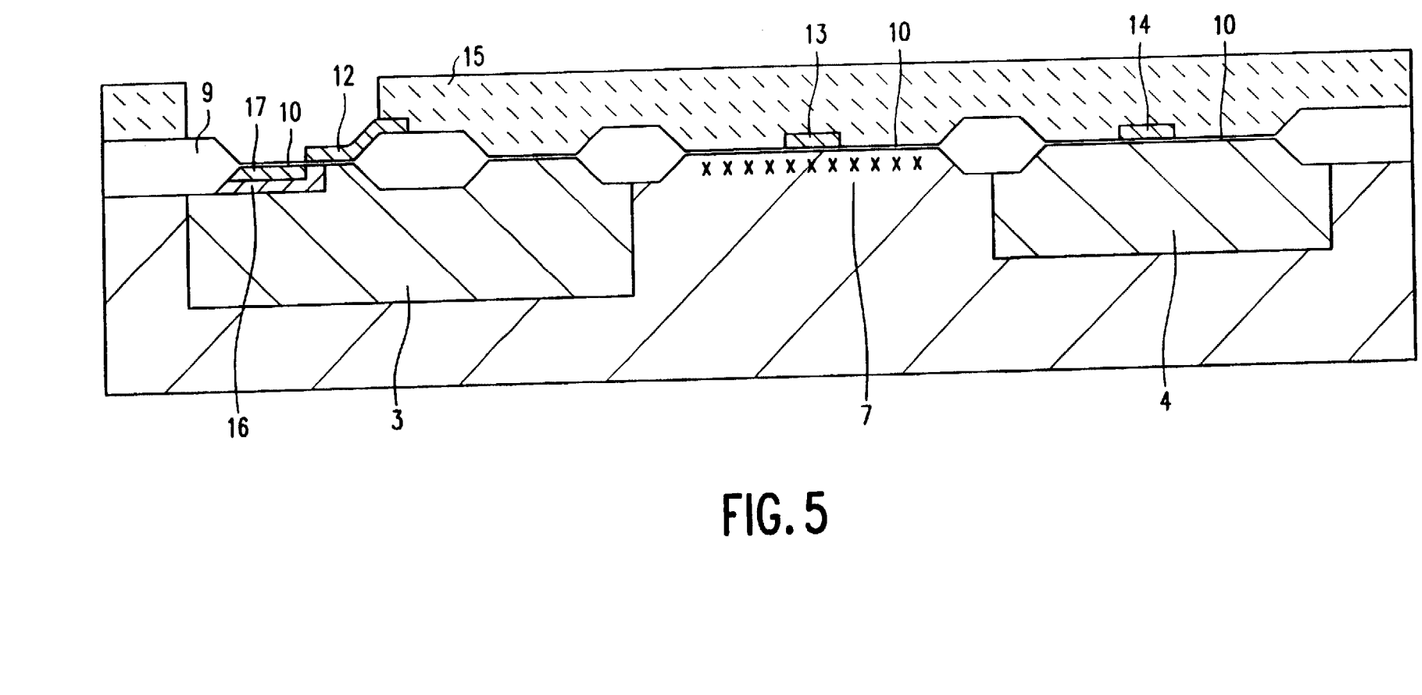
Figure 6:
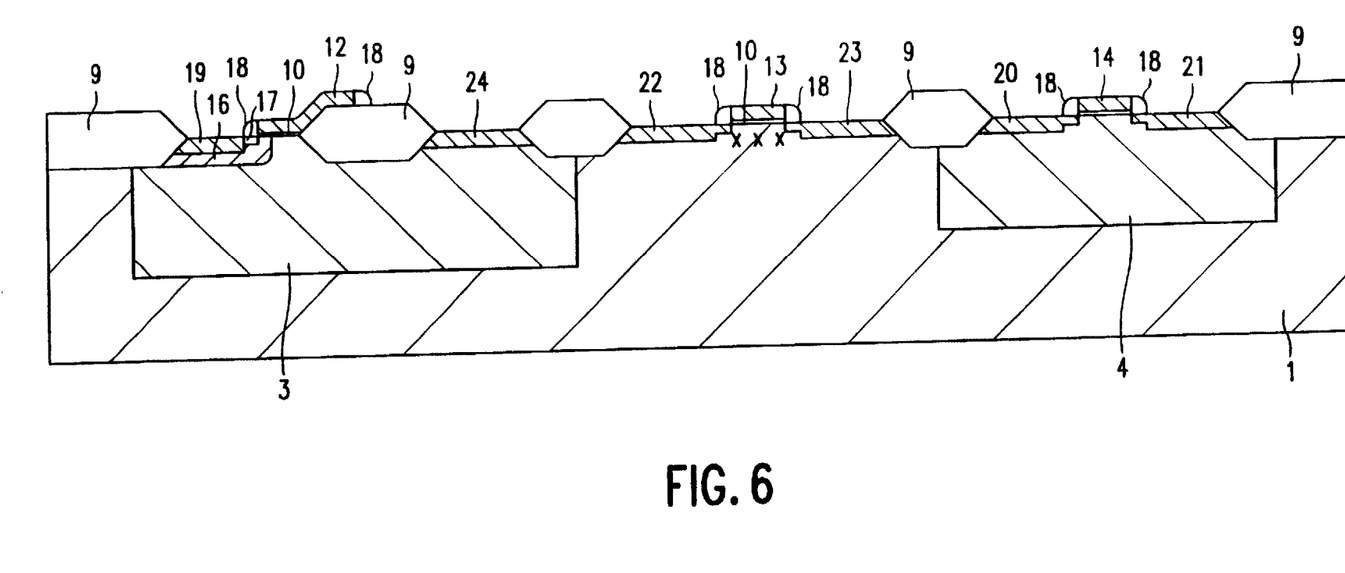

Field oxide 9 is subsequently provided by thermal oxidation in those locations which are not masked by the mask 5, 6, see FIG. 3. Oxidation is continued until an oxide thickness of approximately 0.7 µm has been obtained. The mask 5, 6 is removed after oxidation, whereupon 25 nm thick oxide is grown in a light oxidation step and removed again, after which the gate oxide 10 (FIG. 4) is provided. An implantation mask 11 is then provided on the surface in this example, leaving the active regions 4 and 7 exposed. Boron ions are implanted into the active regions 4 and 7, so that a layer enriched with boron atoms is formed at the surface, indicated with crosses in the drawing. The concentration is so chosen that the threshold voltage of the MOS transistor to be formed has a desired value. Since the threshold voltage is strongly influenced by the doping concentration, it is no longer permitted after this implantation step to carry out high-temperature steps of longer duration above, for example, 1,000° C., which would cause the diffusion of boron into the silicon. After this implantation step, the implantation mask 11 is removed and the crystal damage is restored in a comparatively short high-temperature step (for example at a temperature of approximately 1,000° C.). The gate electrodes 12, 13, 14 of the DMOS transistor, n-channel MOS transistor, and p-channel MOS transistor, respectively, to be formed are then provided through deposition of polycrystalline or amorphous silicon, referred to as poly for short hereinafter, and photolithography. Then a new implantation mask 15 is provided, covering the region of the CMOS transistors and having an opening at the area of the DMOS transistor (FIG. 5). A p-type implantation is subsequently carried out whereby the back-gate region 16 of the DMOST is obtained in a self-aligned manner with respect to the gate 12. The implantation is carried out with a comparatively high dose and at a comparatively great depth. With the implantation mask 15 present, a very light and comparatively shallow n-type implantation is also carried out, whereby a lightly n-type doped portion 17 of the source zone is formed, again self-aligned relative to gate 12. As or Sb is preferably used for this implantation because of the low diffusion coefficient. After removal of the mask 15, a diffusion step is carried out at a temperature so low that the doping in the active region 7 practically does not diffuse any farther, while the boron atoms in the back-gate region do diffuse farther owing to the crystal damage still present. This step is accordingly carried out at a temperature no higher than 950° C. In a specific embodiment, the diffusion is carried out at a temperature of approximately 750° C. for approximately 2 hours, preferably in an oxidizing environment which introduces additional crystal damage into the silicon, thus promoting the diffusion of boron. The boron atoms also diffuse laterally below the gate electrode 12 during this, whereas the n-type dopant in the zone 17 is not or substantially not active in this respect owing to the very low doping concentration of the zone 17 and the low diffusion coefficient of As or Sb. It is thus possible, in spite of the comparatively light diffusion step, to diffuse the back-gate region sufficiently far below the gate electrode 12 and to obtain a doping profile which results in a low threshold voltage of the DMOST and a punch-through voltage which is sufficiently high for many applications. If so desired, n- and p-type implantations may then be carried out locally for obtaining LDD zones in the n-channel MOST and the p-channel MOST. In a next stage (FIG. 6) the side walls of the gate electrode 12 of the DMOST are given spacers 18 of, for example, silicon oxide with a width of, for example, approximately 0.25 μm. These spacers, which can be formed in a manner known per se, are provided simultaneously on the side walls of gates 13 and 14. With the spacer 18 on gate 12 and the field oxide 9 acting as a mask, a strongly doped n-type source zone 19 is now formed which is connected to the channel of the DMOST by means of the remaining portion of the lightly doped n-type zone 17. The p+ source and drain zones 20, 21 of the p-channel MOST and the n+ source and drain zones 22, 23 of the n-channel MOST as well as the n+ drain 24 of the DMOST are provided in usual manner, while locally a p+ zone (not shown in the drawing) may be provided in the back-gate region for connecting the back-gate region conductively to the source connection. The situation shown in FIG. 6 has thus been obtained. The device may subsequently be subjected to usual further process steps such as the provision of a glass layer and the provision of wiring and contacts. Since these steps are generally known, they are not described any further here.

Figure 7:
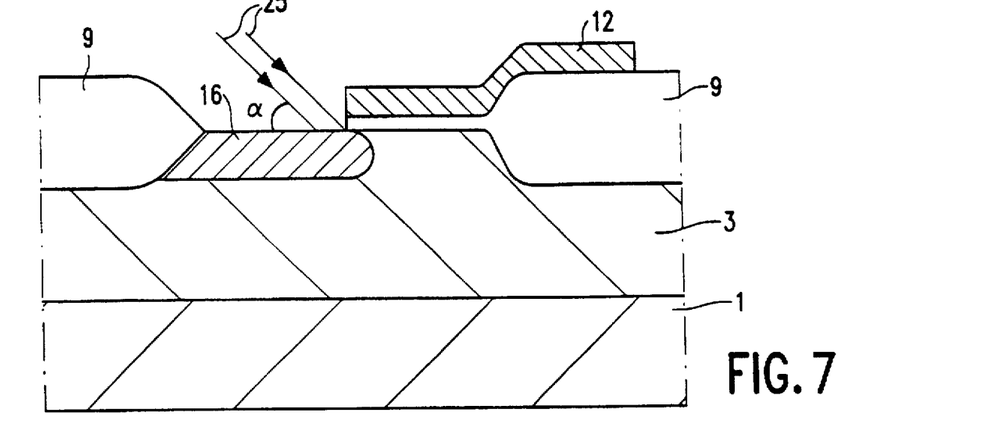
FIG. 7 is a cross-section of the device for the purpose of illustrating a modification of the method of FIGS. 1 to 6.

The implantation of boron for the back-gate region 12 may be carried out obliquely and in various directions in order to increase the quantity of boron atoms in the channel region further. To illustrate this, FIG. 7 shows the portion of the semiconductor body which comprises the back-gate region 16 and the gate electrode 12. To manufacture the backgate region 16, an implantation 25 of boron atoms is carried out not at right angles to the surface of the semiconductor body, as is usual, but at a smaller angle α, so that boron ions are implanted to below the gate electrode 12. After the boron implantation the process may be continued in the same manner as described above.

Figure 8:
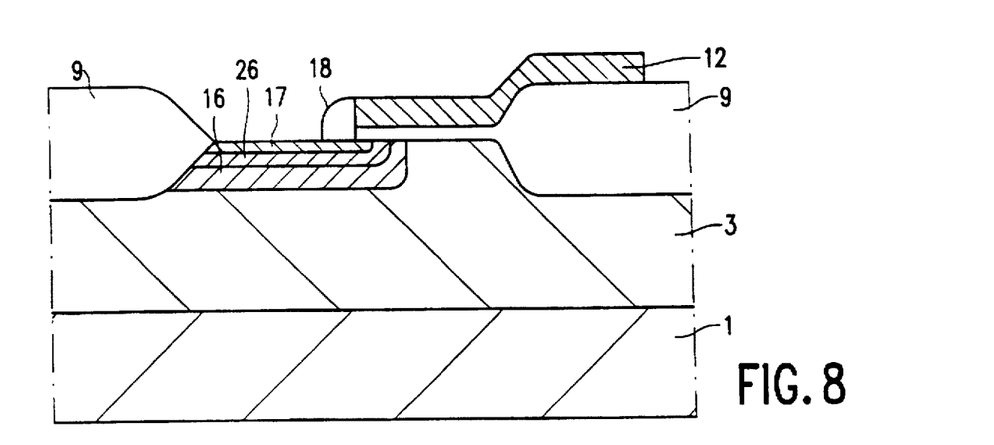
FIG. 8 is a cross-section of the device for the purpose of illustrating a second modification of the method of FIGS. 1 to 6.

FIG. 8 shows a further modification of the process as described with reference to the first embodiment. After the p-type implantation of the back-gate region 16 and the n-type implantation of the weakly doped portion 17 of the source zone, a weak p-type doping 26 is provided, for example with the LDD implantation of the p-type channel MOS transistor, in order to increase the p-type doping concentration. Then the oxide spacer 18 is provided, after which the further process steps as described above can be carried out.

Figure 9:
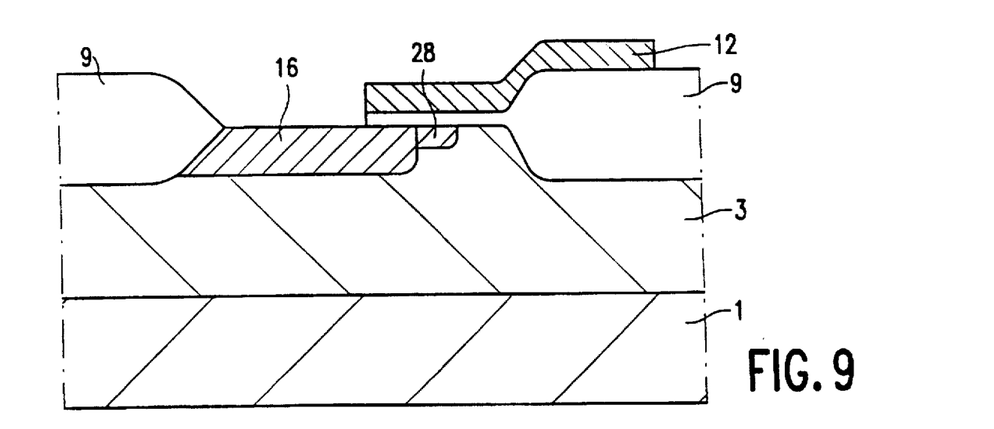
FIG. 9 is a cross-section of the device manufactured by a further modification of the method of FIGS. 1 to 6.

FIG. 9 shows a further modification where a p-type impurity is provided also in the n-well 3 simultaneously with the increase in the p-type concentration in region 7 (see FIG. 4), which is diagrammatically indicated in FIG. 9 as zone 28. This additional doping further improves the punch-through voltage of the DMOST. Since this zone is formed through deposition of poly, it is not self-aligned with respect to the gate electrode 12. This is no disadvantage, however, because the threshold voltage and the channel length are determined by the back-gate region 16 because of the low doping of zone 28. For the rest, the process is identical to the process according to the first embodiment.

It will be obvious that the invention is not limited to the embodiments described here but that many more variations are possible to those skilled in the art within the scope of the invention. Thus the conductivity types may be interchanged in the embodiments described. It is also possible to manufacture different circuit elements, for example a vertical DMOST, in the manner described here. It will also be obvious to those skilled in the art that the invention is not limited to the sequence of process steps described here, but that the order of various steps may be reversed without problems.

What is claimed is:

1. A method of manufacturing a semiconductor device with a DMOS transistor and a MOS transistor in a common semiconductor body, which method comprises the following steps:

local defining of a first active region at the surface of the semiconductor body for the DMOS transistor and of a second active region at the surface of the semiconductor body for the MOS transistor;

providing an electrically insulating layer on the first active region and on the second active region as a gate dielectric for the DMOS transistor and the MOS transistor;

introducing a dopant into the channel region of the MOS transistor to be formed in the second active region;

providing a silicon layer on the semiconductor body, which layer is insulated from the surface of the semiconductor body by the gate dielectric at least at the areas of the first and the second active region, and formation by photolithographic means of gate electrodes of the DMOS transistor and the MOS transistor from said silicon layer;

forming a p-type back-gate region for the DMOS transistor through a comparatively deep implantation of boron ions into the first active region with the gate electrode of the DMOS transistor acting as a mask, whereby the back-gate region is aligned with an edge of the gate electrode;

forming a lightly doped n-type portion of the source zone of the DMOS transistor through an implantation of n-type ions with a comparatively low doping level into the back-gate region with the gate electrode of the DMOS transistor acting as a mask, whereby the lightly doped portion of the source zone is aligned with said edge of the gate electrode;

causing the boron atoms to diffuse farther into the semiconductor body at a temperature lower than 1,000° C.;

providing of a spacer on the gate electrode of the DMOS transistor and the local provision of a comparatively strongly doped source zone at a distance from the gate electrode;

providing source and drain zones for the MOS transistor.

2. A method as claimed in claim 1, further comprising the step of oxidizing the semiconductor body during the step of causing the boron atoms to diffuse farther into the semiconducter body for promoting the diffusion of boron atoms of the back-gate region.

3. A method as claimed in claim 1, characterized in that As or Sb is taken as the dopant for forming the lightly doped portion of the source zone of the DMOST.

4. A method as claimed in claim 1, characterized in that the step of causing the boron atoms in the back-gate region to diffuse farther into the semiconductor body is carried out at a temperature equal to or lower than 950° C.

5. A method as claimed in claim 4, characterized in that the step of causing the boron atoms to diffuse farther into the semiconductor body is carried out at a temperature approximately equal to 750° C.

6. A method as claimed in claim 1, characterized in that the implantation of boron ions is carried out at least partly at an angle such that ions are implanted below the gate electrode of the DMOS transistor.

7. A method as claimed in claim 1, characterized in that the p-type doping in the back-gate region is increased at least locally by a doping step carried out simultaneously with the formation of the LDD portion of a p-channel LDD MOS transistor.

8. A method as claimed in claim 1, characterized in that, before the silicon layer is provided, a boron implantation is carried out at the surface of the semiconductor body for forming the back-gate region of an n-channel MOST, while simultaneously therewith a p-type doping is provided at the area of the back-gate region to be formed of the DMOST.

* * * * *